US012051464B2

(12) United States Patent
Chang et al.

(10) Patent No.: US 12,051,464 B2
(45) Date of Patent: Jul. 30, 2024

(54) SEMICONDUCTOR MEMORY DEVICES WITH DIFFERENT WORD LINES

(71) Applicant: Taiwan Semiconductor Manufacturing Company, Ltd., Hsinchu (TW)

(72) Inventors: Meng-Sheng Chang, Chubei (TW); Chia-En Huang, Xinfeng Township (TW); Gu-Huan Li, Zhubei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 296 days.

(21) Appl. No.: 17/482,073

(22) Filed: Sep. 22, 2021

(65) Prior Publication Data

US 2022/0351774 A1 Nov. 3, 2022

Related U.S. Application Data

(60) Provisional application No. 63/181,462, filed on Apr. 29, 2021.

(51) Int. Cl.
*G11C 11/00* (2006.01)
*G11C 13/00* (2006.01)
*H10B 63/00* (2023.01)
*H10N 70/00* (2023.01)
*H10N 70/20* (2023.01)

(52) U.S. Cl.
CPC ...... *G11C 13/0028* (2013.01); *G11C 13/0004* (2013.01); *G11C 13/004* (2013.01); *G11C 2213/79* (2013.01); *H10B 63/30* (2023.02); *H10N 70/231* (2023.02); *H10N 70/826* (2023.02)

(58) Field of Classification Search
CPC .............. G11C 11/1675; G11C 11/161; G11C 11/1655; G11C 11/1657; G11C 11/1673; G11C 11/1697; G11C 13/0028; G11C 13/0004; G11C 13/004; G11C 2213/79; G11C 13/003; G11C 2213/74; G11C 2213/82; G11C 13/0026; H10B 61/22; H10N 50/10
See application file for complete search history.

(56) References Cited

U.S. PATENT DOCUMENTS

| | | | | |
|---|---|---|---|---|
| 9,792,987 B1* | 10/2017 | Chou | .................. | G11C 13/0023 |
| 11,024,381 B2* | 6/2021 | Chih | .................... | H10N 70/841 |
| 2011/0096588 A1* | 4/2011 | Fasoli | ................ | G11C 13/0004 365/72 |
| 2019/0385656 A1* | 12/2019 | Lee | ...................... | G11C 11/1657 |

* cited by examiner

*Primary Examiner* — Hien N Nguyen
(74) *Attorney, Agent, or Firm* — FOLEY & LARDNER LLP

(57) ABSTRACT

A memory device includes a bit line (BL); a source line (SL); and a plurality of non-volatile memory cells operatively coupled between the BL and SL, respectively. Each of the plurality of non-volatile memory cells includes a resistor with a variable resistance, a first transistor, and a second transistor that are coupled to each other in series. In response to a first one of the non-volatile memory cell not being read and a second one of the non-volatile memory cell being read, a voltage level at a first node connected between the first and second transistors of the first non-volatile memory cell is greater than zero.

15 Claims, 7 Drawing Sheets

SEMICONDUCTOR MEMORY DEVICES WITH DIFFERENT WORD LINES

CROSS-REFERENCE TO RELATED APPLICATION

This application claims priority to and the benefit of U.S. Provisional Application No. 63/181,462, filed Apr. 29, 2021, entitled "A SENSING METHOD FOR PCRAM," which is incorporated herein by reference in its entirety for all purposes.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. A phase change random-access memory (PCRAM) device is one promising candidate for next generation non-volatile memory technology due to its simple structure and Complementary Metal-Oxide-Semiconductor (CMOS) logic compatible process technology that is involved. In general, a PCRAM device includes a number of PCRAM cells. Each PCRAM cell includes a phase change material layer with a variable resistance, which is placed between two electrodes disposed within metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
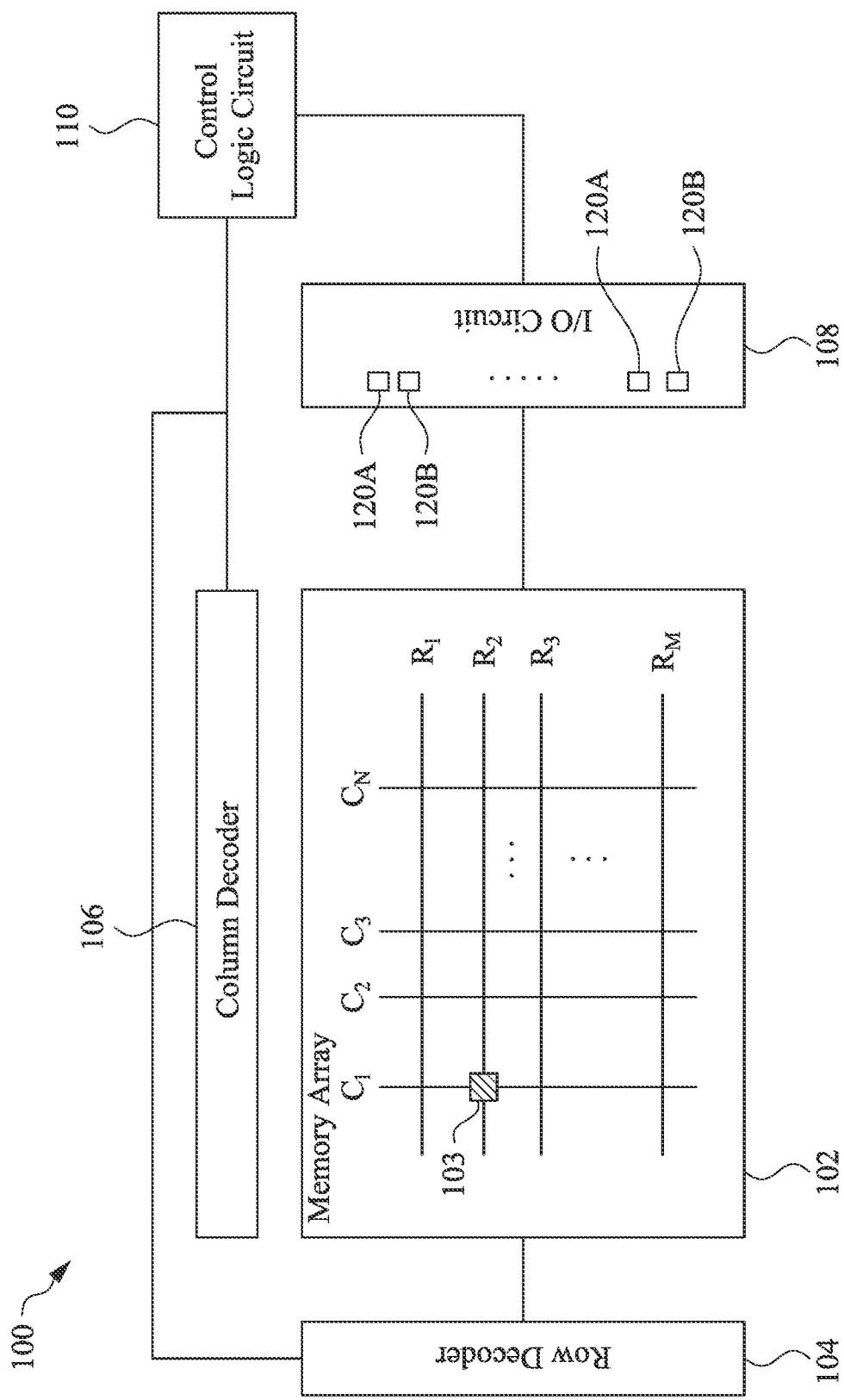
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phase change random-access memory (PCRAM) cells are non-volatile memory cells that store information by changes in electric resistance. In general, a PCRAM cell uses chalcogenide semiconductors for storing states. The chalcogenide semiconductors, also called phase change materials, have a crystalline state and an amorphous state. In the crystalline state, the phase change materials have a low resistance, while in the amorphous state they have a high resistance. The resistance ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states. For example, the PCRAM cell has a state of relatively high resistance, referred to as "a high resistance state," and a state of relatively low resistance, referred to as "a low resistance state." The PCRAM cell may be switched from the high resistance state to the low resistance state, or from the low resistance state to high resistance state by applying a predetermined voltage or current. The PCRAM cell can be used in One-Time Programmable (OTP) applications, multiple-time programmable (MTP) applications, etc.

In the existing configurations of PCRAM devices, each PCRAM cell is typically constituted by a PCRAM resistor and a transistor (sometimes referred to as a "one-transistor-one-resistor (1T1R)" configuration). The PCRAM resistor may reversibly (in MTP applications) or irreversibly (in OTP applications) transition between a first resistance state and second resistance state, which correspond to a first logic state and second logic state, respectively. In general, such PCRAM cells may be arranged as an array, for example, the PCRAM cells arranged in a number of columns and a number of rows. To uniquely access (e.g., read) one of the cells, a first access line (e.g., a bit line (BL)), coupled to a group of cells including the to-be accessed cell, is asserted, and a second access line (e.g., a word line (WL)) gating a transistor of the to-be accessed cell is asserted. Accordingly, the to-be accessed cell is selected. A logic state of the selected cell can be read based on a current level flowing through the selected cell.

However, such 1T1R configurations may encounter various issues when the technology nodes continue to shrink.

Although only the transistor of the selected cell is asserted (e.g., turned on), one or more of the transistors of unselected cells that are also coupled to the same BL may have leakage, even being turned off. Such leakage current can accumulate. When a level of the leakage current exceeds a certain threshold, the PCRAM device can malfunction. For example, the logic state of a selected cell, which is supposedly to be read as logic 1 (when its resistance state is in a high state thereby conducting a low or no current level), will be misread as logic 0 because of the contribution of leakage current flowing through the unselected cells. Alternatively stated, the leakage current can alter a relatively low current level (corresponding to a first logic state) to a relatively high current level (corresponding to a second, different logic state). Thus, the current PCRAM devices have not been entirely satisfactory in every aspect.

The present disclosure provides various embodiments of a PCRAM device that includes a number of PCRAM cells, each of which includes a resistor with a variable resistivity values, a first transistor, and a second transistor coupled in series. Such a configuration may sometimes be referred to as a "two-transistors-one-resistor (2T1R)" configuration. Further, the first and second transistors of each of the PCRAM cells are gated by respective different access lines (e.g., word lines (WLs)), thereby significantly limiting leakage current conducting through some of the unselected cells, in various embodiments. For example, the first transistor, serially coupled between the PCRAM resistor and the second transistor, may be gated by a first WL; and the second transistor, serially coupled between the first transistor and another access line (e.g., a source line (SL) typically tied to a fixed supply voltage), may be gated by a second WL. While reading a selected cell by asserting yet another access line, e.g., a bit line (BL), that is coupled to the selected cell and a certain number of unselected cell, the second WL may provide a voltage level different from (e.g., slightly higher than) that provided by the first WL. As such, the voltage level present on a node commonly connecting to the first and second transistors of each unselected cell can be pulled up higher than a voltage level present on a gate terminal of the first transistor. With such a voltage difference across the first transistor for each of the unselected cells, leakage current flowing through the unselected cells can be significantly limited. Accordingly, various characteristics (e.g., read margins) of the disclosed PCRAM device can be improved over the existing PCRAM devices.

FIG. 1 illustrates a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, the components of the memory device 100 may be operatively coupled to each other and to the control logic circuit 112. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In one aspect of the present disclosure, each memory cell 103 is implemented as a PCRAM cell that includes an PCRAM resistor with a variable resistivity value, a first transistor, and a second transistor coupled in series. The first and second transistors can be coupled to (e.g., gated by) respective different WLs. Specifically, the first transistor, serially coupled between the PCRAM resistor and the second transistor, is gated by a first WL; and the second transistor, serially coupled between the first transistor and a SL (e.g., typically tied to ground), is gated by a second WL. The first transistor and second transistor may sometimes be referred to as a "active transistor" and "footer transistor," respectively, in the following discussions. Although the present disclosure is directed to implementing the memory cell 103 as a PCRAM cell, it should be understood that the memory cell 103 can include a ferroelectric random access memory (FeRAM) cell, a resistive random access memory (RRAM) cell, a magnetic tunnel junction random access memory (MTJ RAM) cell, a spin transfer torque magnetic random access memory (STT-MRAM) cell, etc., while remaining within the scope of present disclosure.

For each PCRAM cell, the first and second transistors can be concurrently turned on/off to enable/disable an access (e.g., program, read) to the corresponding PCRAM resistor. For example, upon being selected, the first and second transistors of the selected PCRAM cell can be turned on to generate a program or read path conducting through its PCRAM resistor and those two transistors. Further, with the footer transistors gated by a slightly higher voltage level (e.g., 0.1V), the active transistors of those unselected PCRAM cells (with their gates supplied with a lower voltage level, e.g., 0V) can remain turned-off as the voltage on a source terminal of the active transistor (if implemented as an n-type transistor) can be pulled higher than the voltage on a gate terminal of the active transistor, which can advantageously assure a read margin of the selected PCRAM to remain optimally wide. Detailed descriptions on configurations of the memory cell 103 will be discussed below with respect to FIGS. 2A and 2B.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. For example, the I/O circuit 108 can include a number of pairs of level shifters 120A and 120B. The level shifters 120A and 120B are operatively coupled to the different (e.g., the first and second) WLs of each of the memory cells 103. Each of the level shifters can translate a logic signal from one level to another, in accordance with various embodiments. With a respective level shifter coupled to each of the first and second WLs, the active and footer transistors of each cell can be independently controlled (e.g., gated). The control logic circuit 110 is a hardware component that can control the coupled components (e.g., 102 through 108). Detailed descriptions on operations of the memory device 100 are provided below with respect to FIGS. 4A and 4B.

Figure 2A:
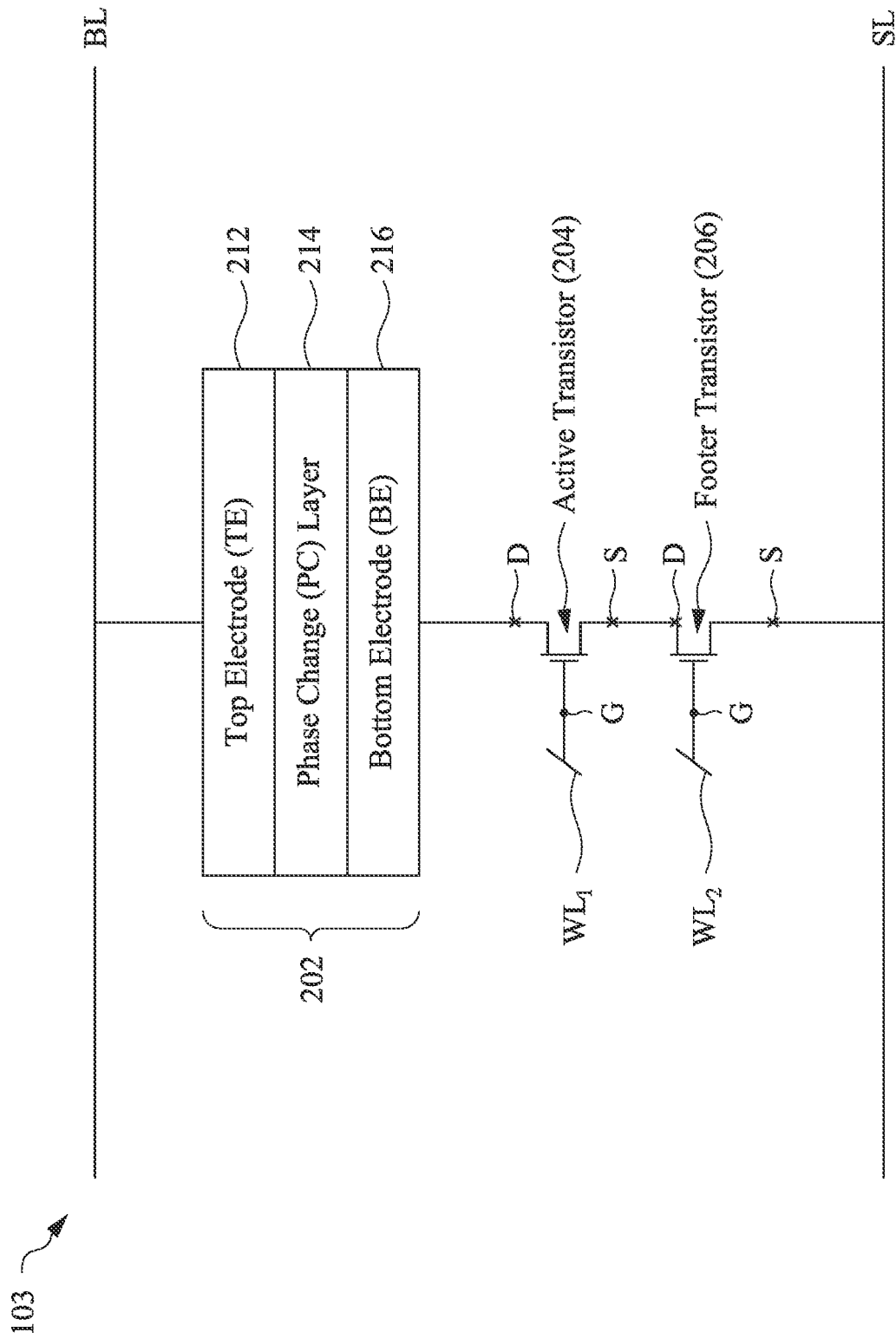
FIG. 2A illustrates an example circuit diagram of a memory cell of the memory device of FIG. 1, in accordance with some embodiments.

FIG. 2A illustrates an example configuration of the PCRAM cell 103 (FIG. 1), in accordance with some embodiments. The PCRAM cell 103 is implemented as a 2T1R PCRAM configuration, for example, a resistor 202 with a variable resistivity value (sometimes referred to as an "PCRAM resistor") serially connected to an active transistor 204, which is further serially connected to a footer transistor 206. It, however, should be understood that any of various other PCRAM configurations that exhibit the characteristic of variable resistance and multi-threshold voltages may be used by the PCRAM cell 103 such as, for example, a 2-diodes-1 resistor (2D1R) configuration, a many-transistors-one-resistor (manyT1R) configuration, etc., while remaining within the scope of the present disclosure.

The resistor 202 is formed as a multi-layer stack that includes a top electrode (TE) 212, a phase change (PC) layer 214, and a bottom electrode (BE) 216. The TE 212 may include a metal material selected from the group consisting of: copper (Cu), aluminum (Al), tungsten (W), chromium (Cr), platinum (Pt), titanium nitride/titanium (TiN/Ti), TiN, ruthenium (Ru), nickel (Ni), and combinations thereof; and the BE 216 may include a metal material selected from the group consisting of: Cu, Al, W, Cr, Pt, TiN/Ti, TiN, Ru, Ni, and combinations thereof. Although there are three layers shown that constitute the resistor 202, it should be understood that the resistor 202 can include any number of layers, while remaining within the scope of present disclosure. For example, the resistor 202 may have a capping layer (e.g., formed of Ti, Ni, Hf, Nb, Co, Fe, Cu, V, Ta, W, Cr, of combinations thereof) interposed between the TE 212 and the resistor 214.

Referring still to the resistor 202, the PC layer 214 may include a PC-based material, which may be a chalcogenide-based material, for example. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). The PC layer 214 may include a phase change alloy such as, for example, Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te, Te/Ge/Sb/S, or combinations thereof. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. In general, the PC layer 214 may be formed by deposition, for example, atomic layer deposition (ALD), chemical vapor deposition (CVD), meta-organic chemical vapor deposition (MOCVD), etc., to have a particular thickness and crystalline structure using a particular manufacturing process recipe.

Phase change alloys (e.g., the PC layer 214) can switch between a first structural state in which the material is in a generally amorphous solid phase, and a second structural state in which the material is in a generally crystalline solid phase in its local order. These alloys are at least bistable. The term amorphous is referred to as a relatively less ordered structure, more disordered than a single crystal, which has the detectable characteristics such as higher electrical resistivity than the crystalline phase. The term crystalline is referred to as a relatively more ordered structure, more ordered than in an amorphous structure, which has detectable characteristics such as lower electrical resistivity than the amorphous phase. In general, the phase change material may irreversibly or reversibly switch between completely amorphous and completely crystalline states, thereby causing a corresponding PC layer to switch between a high resistance state (HRS) and a low resistance state (LRS), which will be further discussed below.

The active transistor 204 and footer transistor 206 each include an n-type transistor, but the active transistor 204 and footer transistor 206 can each be implemented as a p-type transistor, while remaining within the scope of present disclosure. In various embodiments, a drain terminal of the active transistor 204 is connected to the BE 218, a gate terminal of the active transistor 204 is connected to a first word line ($WL_1$), a source terminal of the active transistor 204 is connected to a drain terminal of the footer transistor 206, a gate terminal of the footer transistor 206 is connected to a second WL ($WL_2$), and a source terminal of the footer transistor 206 is connected to a source line (SL). The SL may be connected to ground when the transistors 204 and 206 are implemented as n-type transistors; and the SL may be connected to VDD when the transistors 204 and 206 are implemented a p-type transistors. Further, the TE 212 is coupled to a bit line (BL) configured to receive various voltage signals (e.g., a read voltage signal, a program voltage signal, which will be discussed below) from the I/O circuit 108 (FIG. 1).

Each of the $WL_1$ and $WL_2$ is configured to receive a control signal from the I/O circuit 108 (FIG. 1) to enable the access to a selected PCRAM cell (e.g., to program or read the selected PCRAM cell). Voltage levels of the control signals applied to the $WL_1$ and $WL_2$ of the selected cell, regardless of being programmed or read, may be similar to each other. On the other hand, voltage levels of the control signals applied to the $WL_1$ and $WL_2$ of an unselected cell may be different from each other, based on whether the coupled, selected cell is being programmed or read, in some embodiments.

For example, when one of a number of cells coupled to a same BL is selected to be programmed, voltage levels applied to the $WL_1$ and $WL_2$ of that selected cell may be similar (e.g., both corresponding to a high logic state, if the active and footer transistors are both n-type transistors), while voltage levels applied to the $WL_1$ and $WL_2$ of the rest of (unselected) cells may also be similar (e.g., both corresponding to a low logic state). In another example, when one of a number of cells coupled to a same BL is selected to be read, voltage levels applied to the $WL_1$ and $WL_2$ of that selected cell may be similar (e.g., both corresponding to a high logic state, if the active and footer transistors are both n-type transistors), while voltage levels applied to the $WL_1$ and $WL_2$ of the rest of (unselected) cells may be different from each other even still corresponding to a low logic state. For instance, the voltage level present on the $WL_1$ (gating the active transistor 204 of the unselected cell) may be close to 0V, while the voltage level present on the $WL_2$ (gating the footer transistor 206) may be slightly higher than 0V, e.g., about 0.1V, which can significantly limit the leakage current conducting through the unselected cells as described above. Details of operations of the memory device 100 that include the PCRAM cells shown in FIG. 2A will be discussed below with respect to FIG. 4A.

Each of the PCRAM cells of the memory array 102 is configured to switch between a first logic state and a second logic state by changing a resistance state (HRS or LRS) of the corresponding PC layer, irreversibly or reversibly. For example, when a PC layer 214 is in the HRS state, the corresponding PCRAM cell 103 can conduct a relatively low level of current, which may correspond to a first logic state (e.g., logic 1); and when the PC layer 214 is in the LRS state, the PCRAM cell 103 can conduct a relatively high level of current, which may correspond to a second logic state (e.g., logic 0). It should be noted that the transition between the HRS and LRS may be irreversible or reversible. With the reversible transition, the PCRAM cell 103 (e.g., as fabricated) may present an HRS, and upon being programmed, the PCRAM cell 103 can switch to a LRS. With the irreversible transition, the PCRAM cell 103 may function as a one-time-programmable memory cell (e.g., an electrical fuse (efuse)). As fabricated, such an efuse cell 103 may present a LRS (or short circuit) and may irreversibly switch to a HRS (or open circuit) after being programmed.

Figure 2B:
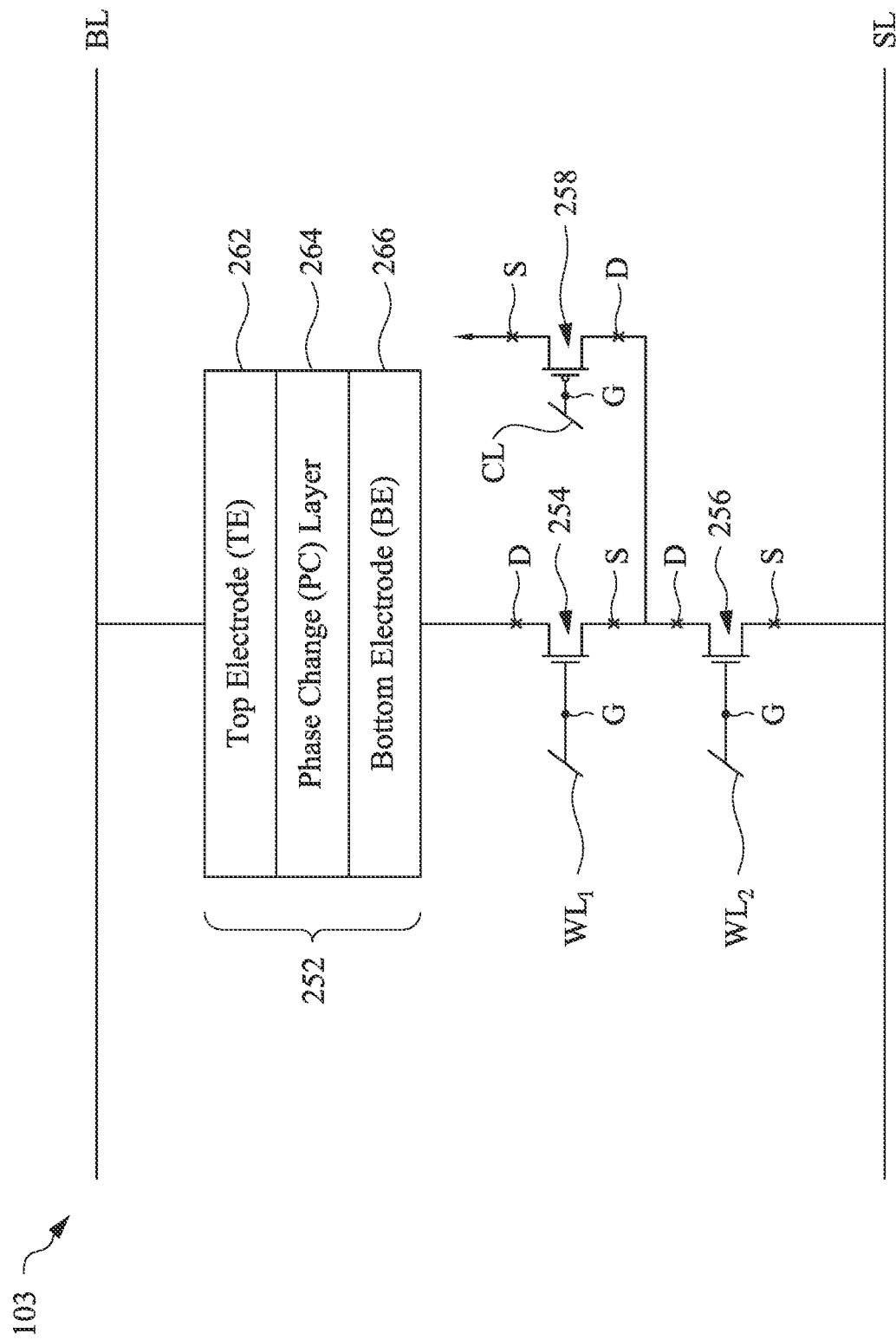
FIG. 2B illustrates another example circuit diagram of a memory cell of the memory device of FIG. 1, in accordance with some embodiments.

FIG. 2B illustrates another example configuration of the PCRAM cell 103 (FIG. 1), in accordance with some embodiments. The PCRAM cell 103 shown in FIG. 2B is substantially similar to the example shown in FIG. 2A (e.g., also implemented as a 2T1R PCRAM configuration) except that the FIG. 2B example further includes a different conduction type of transistor coupled between the active and footer transistors.

As shown in FIG. 2B, the PCRAM cell 103 includes a resistor 252 (constituted at least by a TE 262, a PC layer 264, and a BE 266), an active transistor 254, and a footer transistor 256, which are substantially to the corresponding components described with respect to FIG. 2A, for example, the resistor 202 (and its TE 212, PC layer 214, and BE 216), the active transistor 204, and footer transistor 206. Thus, the following discussions will be focused on transistor 258 connected to a common node between the active transistor 254 and footer transistor 256.

In some embodiments, the transistor 258 has an opposite conduction type to the conduction type of the active and footer transistors 254 and 256. For example, the active and footer transistors 254 and 256 are each an n-type transistor, and the transistor 258 is a p-type transistor. It should be appreciated that the conduction types can be switched, while remaining within the scope of present disclosure. In the example where the transistors 254 and 256 are n-type and transistor 258 is p-type, the source terminal of the active transistor 254 and the drain terminal of footer transistor 256 are connected at a common node, and the transistor 258 is connected to such a common node with its drain terminal. Further, the transistor 258 is gated by a control line (CL) and sourced from a supply voltage 259.

Similar as the example of FIG. 2A, each of the $WL_1$ and $WL_2$ (FIG. 2B) is configured to receive a control signal from the I/O circuit 108 (FIG. 1) to enable the access to a selected PCRAM cell (e.g., to program or read the selected PCRAM cell). Voltage levels of the control signals applied to the $WL_1$ and $WL_2$ of the selected cell, regardless of being programmed or read, may be similar to each other. Different from FIG. 2A, voltage levels of the control signals applied to the $WL_1$ and $WL_2$ of an unselected cell can still be similar to each other, regardless of being programmed or read. However, the transistor 258 of the unselected cell is configured to be turned on (e.g., through the CL), when any coupled cell is selected to be read, in some embodiments.

For example, when one of a number of cells coupled to a same BL is selected to be programmed, voltage levels applied to the $WL_1$ and $WL_2$ of that selected cell may be similar (e.g., both corresponding to a high logic state, if the active and footer transistors are both n-type transistors), while voltage levels applied to the $WL_1$ and $WL_2$ of the rest of (unselected) cells may also be similar (e.g., both corresponding to a low logic state). In some embodiments, the transistors 258 of all the cells coupled to the BL may be turned off. In another example, when one of a number of cells coupled to a same BL is selected to be read, voltage levels applied to the $WL_1$ and $WL_2$ of that selected cell may be similar (e.g., both corresponding to a high logic state, if the active and footer transistors are both n-type transistors), while voltage levels applied to the $WL_1$ and $WL_2$ of the rest of (unselected) cells can still be similar to each other but corresponding to a low logic state. In some embodiments, the transistor 258 of the selected cell may remain off, while the transistors 258 of the unselected cells may be turned on. For instance, the voltage levels present on the $WL_1$ and $WL_2$ (gating the active transistor 204 and footer transistor 206 of the unselected cell, respectively) may both be close to 0V, while the transistor 258 is turned on to raise a voltage level at the common node between the active and footer transistors. It can significantly limit the leakage current conducting through the unselected cells as described above. Details of operations of the memory device 100 that include the PCRAM cells shown in FIG. 2B will be discussed below with respect to FIG. 4B.

Figure 3:
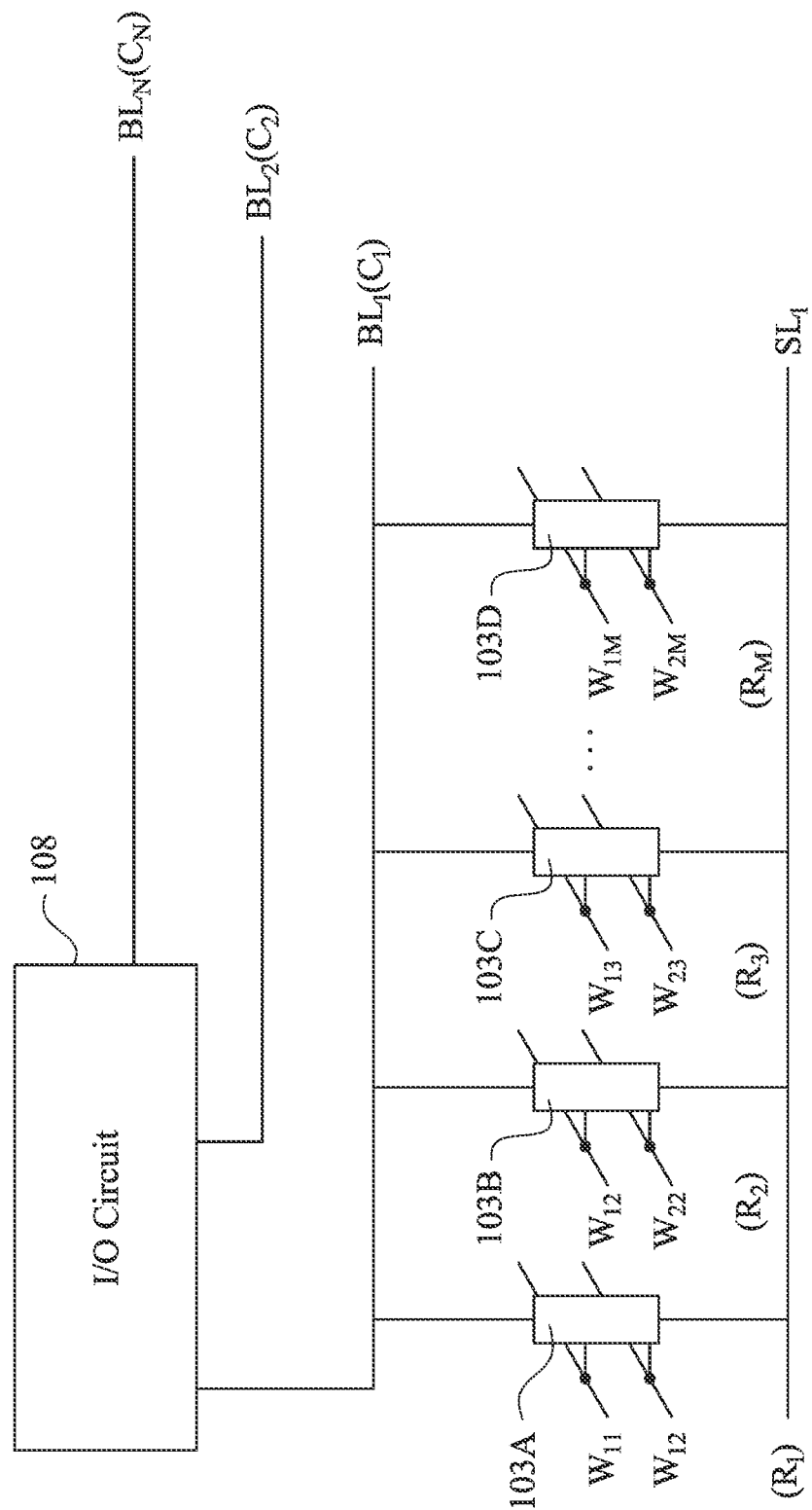
FIG. 3 illustrates a circuit diagram of a memory array of the memory device of FIG. 1, in accordance with some embodiments.

FIG. 3 illustrates an example circuit diagram of a portion of the memory device 100 (FIG. 1), in accordance with various embodiments. In the illustrated example of FIG. 3, four PCRAM cells, 103A, 103B, 103C, and 103D, of the memory array 102 are shown. Each of the cells 103A-D is substantially similar to the PCRAM cell 103 discussed with respect to FIG. 2A or 2B. Although four PCRAM cells are shown, it should be appreciated that the memory array 102 can have any number of PCRAM cells, while remaining within the scope of present disclosure.

As mentioned above with respect to FIG. 1, the PCRAM cells 103 of the memory array 102 are formed as an array, in which the PCRAM cells are arranged over a number of columns and a number of rows. For example, a subset of the PCRAM cells is arranged along one of the rows, and each of the subset of PCRAM cells is arranged along a respective column. Alternatively stated, each of the PCRAM cells is arranged at the intersection of a column and a row. As shown in the example of FIG. 3, the PCRAM cell 103A is arranged at the intersection of column $C_1$ and row $R_1$; the PCRAM cell 103B is arranged at the intersection of column $C_1$ and row $R_2$; the PCRAM cell 103C is arranged at the intersection of column $C_1$ and row $R_3$; and the PCRAM cell 103D is arranged at the intersection of column $C_1$ and row $R_M$. The column $C_1$ includes a first bit line $BL_1$ and a first source line $SL_1$, while the other columns ($C_2 \ldots C_N$) each include its respective BL ($BL_2$, $BL_N$) and SL (not shown). The row $R_1$ includes word lines $WL_{11}$ and $WL_{21}$; the row $R_2$ includes word line $WL_{12}$ and $WL_{22}$; the row $R_3$ includes word lines $WL_{13}$ and $WL_{23}$; and the row $R_M$ includes word lines $WL_{1M}$ and $WL_{2M}$.

It should be noted that the bit lines and source lines are not necessarily disposed in the column of a memory array, neither are the word lines disposed in the row of a memory array. For example, in some other embodiments, the bit line and source line may be disposed along a corresponding one of a number of rows of a memory array and the word line may be disposed along a corresponding one of a number of columns of the same memory array, while remaining within the scope of present disclosure.

Referring still to FIG. 3, each of the PCRAM cells 103 is operatively coupled to the I/O circuit 108 through a corresponding one of the BLs and a corresponding pair of the WLs. In various embodiments, the I/O circuit 108 includes at least a program circuit and a read circuit that can respectively program and read each of the PCRAM cells 103 through the respective BL, which will be discussed in FIGS. 4A-B as follows. In the following discussions, the PCRAM cells 103 are each configured as an efuse, i.e., the PCRAM cell 103 being fabricated as an short circuit (in the LRS) and programmed to be an open circuit (in the HRS).

Figure 4A:
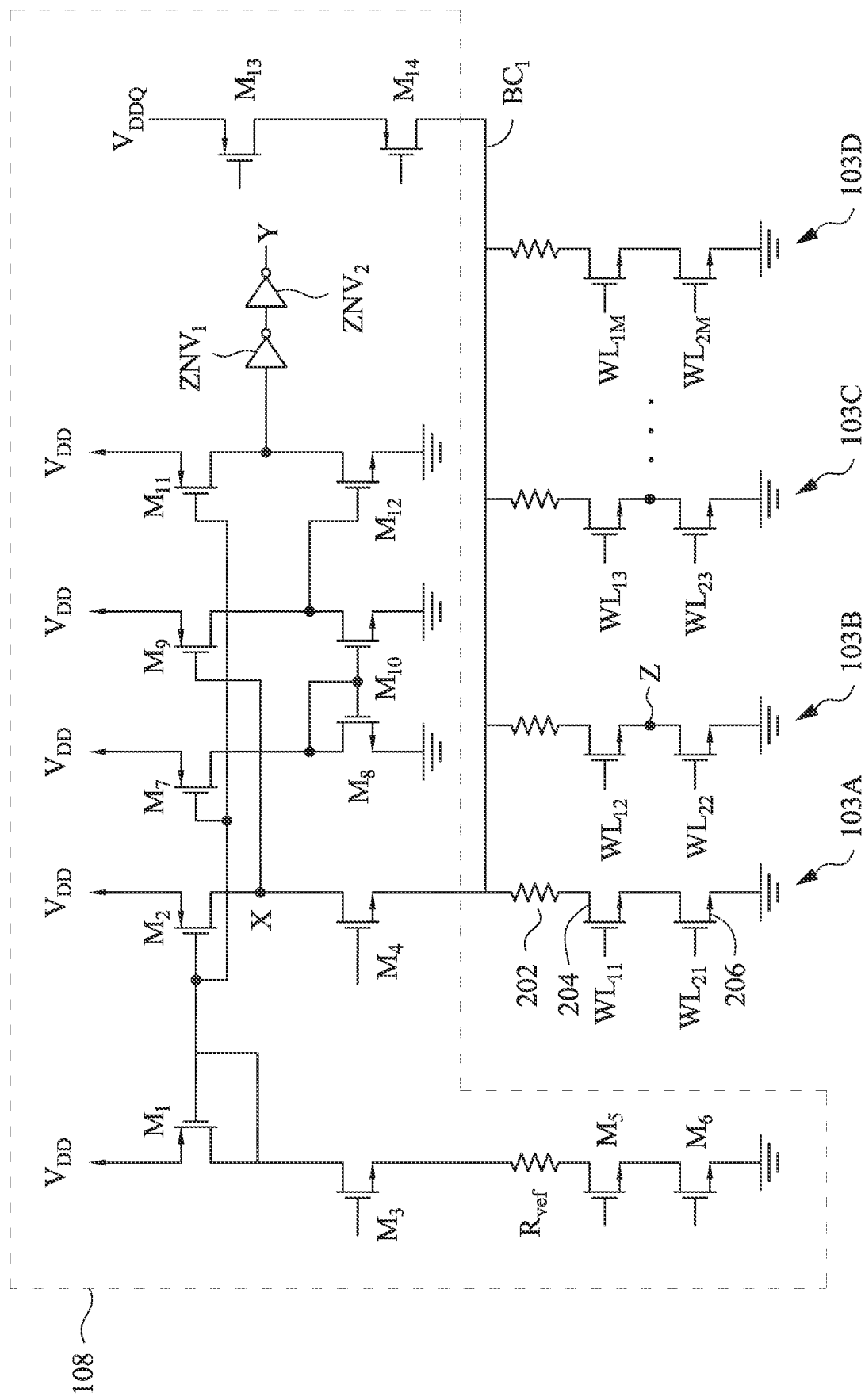
FIG. 4A illustrates a circuit diagram of an input/output (I/O) circuit of the memory device of FIG. 1 that is coupled to memory cells of FIG. 2A, in accordance with some embodiments.

FIG. 4A illustrates an example circuit diagram of the I/O circuit 108 coupled to the PCRAM cells 103A-D through $BL_1$, in accordance with various embodiments. The PCRAM cells 103A-D of FIG. 4A are each be implanted as the example of FIG. 2A, i.e., a PCRAM resistor serially coupled to a pair of transistors without additional transistor coupled to the common node between the pair of transistors. It should be understood that the circuit diagram of the I/O circuit 108 shown in FIG. 4A is simplified for illustration purposes, and thus, the I/O circuit 108 can include any of various other components, while remaining within the scope of present disclosure.

As shown in FIG. 4A, the I/O circuit 108 includes a number of transistors, M1, M2, M3, M4, M5, M6, M7, M8, M9, M10, M11, M12, M13, and M14; a reference resistor, Rref; and inverters, INV1 and INV2. Most of the transistors of the I/O circuit 108 may be operated under supply voltages, VDD and ground. In some embodiments, the transistors M1, M2, M7, M9, M11, M13, and M14 may each be implemented as a p-type transistor; and the transistors M3, M4, M5, M6, M8, M10, and M12 may each be implemented as an n-type transistor. Further, the transistors M13 and M14 may function at least as a portion of a program circuit configured to program a selected one of the PCRAM cells 103A-D; and the transistors M1 to M6 may function at least as a portion of a read circuit to read a selected one of the PCRAM cells 103A-D, with the transistors M7 to M12 being optional.

To program a selected one of the PCRAM cells 103A-D (e.g., 103A), $BL_1$ is asserted and $WL_{11}$ and $WL_{21}$ are asserted, while the rest of the WLs are deasserted. The transistor M4 is turned off (e.g., by applying a logic low signal to its gate terminal), thereby disconnecting the read circuit from the PCRAM cells along $BL_1$. On the other hand, the transistors M13 and M14 are turned on (e.g., by applying a logic low signal to their gate terminals), thereby connecting the program circuit to the PCRAM cells along $BL_1$. Upon being turned on, the transistors M13 and M14 (the program circuit) can propagate a program voltage, VDDQ, to the selected PCRAM cell 103A through $BL_1$, while not propagating the program voltage to the unselected PCRAM cells, e.g., 103B-D. As a non-limiting example, when in this program mode, the program voltage, VDDQ, may be about 1.8V, $WL_{11}$ and $WL_{21}$ may be asserted with a similar level of voltage signal, 1.8V, and the rest of WLs (e.g., $WL_{12}$, $WL_{22}$, $WL_{13}$, $WL_{23}$, $WL_{1M}$, $WL_{2M}$) may be deasserted with a voltage level of about 0V.

To read a selected one of the PCRAM cells 103A-D (e.g., 103A), $BL_1$ is asserted and $WL_{11}$ and $WL_{21}$ are asserted, while the rest of the WLs are deasserted. The transistor M4 is turned on (e.g., by applying a logic high signal to its gate terminal), thereby connecting the read circuit to the PCRAM cells along $BL_1$. On the other hand, the transistors M13 and M14 are turned off (e.g., by applying a logic high signal to their gate terminals), thereby disconnecting the program circuit from the PCRAM cells along $BL_1$. When the transistor M4 is turned on, the transistors M3, M5, and M6 are turned on. The reference resistor Rref can function as a reference to be compared with a resistance value of the selected PCRAM cell, thereby allowing the inverters INV1 and INV2 to output a logic state at node Y.

For example, if the resistor of the selected PCRAM cell 103A is in a LRS (e.g., not programmed yet), a current conducting through the reference resistor Rref can be mirrored from a first current path, flowing through the transistor M1 to ground, to a second current path, flowing through the transistors M2 and M4, the selected PCRAM cell 103A, and to ground. As such, a voltage level at node X is pulled down to ground, which can turn on the transistor M9 to propagate VDD (a logic high state) to a gate terminal of the transistor M12. The transistor M12 is turned on. Next, an input of the inverter INV1 can be pulled down to ground (a logic low state) through the turned-on transistor M12. Thus, the invertor INV2 can output a logic low state at node Y.

If the resistor of the selected PCRAM cell 103A is in a FIRS (e.g., already programmed), a current conducting through the reference resistor Rref can be mirrored from a first current path, flowing through the transistor M1 to ground, to a second current path, flowing through the transistors M2 and M4, but not to ground as the resistor of the PCRAM cell 103A presents an open circuit. As such, a voltage level at node X cannot be pulled down to ground. Instead, the voltage level at node X may remain at about VDD through the transistor M2, i.e., VDD-Vth (a threshold voltage of the transistor M2), which can turn off the transistor M9. The turned-off transistor M9 can cause the transistor M12 to be turned off. Referring again to the transistor M2, as its drain terminal (node X) is pulled up to about VDD-Vth, its gate terminal may present a similar voltage level, VDD-Vth, which in turn can turn on the transistor M11 such that VDD (a logic high state) is propagated to the input of the inverter INV1 through the turned-on transistor M11. Thus, the invertor INV2 can output a logic high state at node Y.

As a non-limiting example, when in this read mode, the program voltage, VDDQ, may remain at about 1.8 V, but the transistors M13 and M14 are turned off. $WL_{11}$ and $WL_{21}$ may be asserted with a voltage level at about 0.75V that corresponds to a logic high state. The rest of WLs that gate the active transistors 204 (e.g., $WL_{12}$, $WL_{13}$, $WL_{1M}$) may be deasserted with a voltage level of about 0V that corresponds to a logic low state; and the rest of WLs that that gate the footer transistors 206 (e.g., $WL_{22}$, $WL_{23}$, $WL_{2M}$) may also be deasserted with a voltage level slightly above 0V that still corresponds to a logic low state. With the logic high state applied on the gate terminals of the active transistor 204 and footer transistor 206 of the selected PCRAM cell 103A, the logic state of the PCRAM cell 103A (depending on whether or not the resistor 202 is programmed) can be read out, as discussed above. On the other hand, the gate terminals of the active transistor 204 of each of the unselected cells (e.g., 103B-D) are applied with a signal of about 0V and the gate terminals of the footer transistor 206 of each of the unselected cells (e.g., 103B-D) are applied with a voltage signal slightly above 0V (e.g., 0.1V), thereby assuring those unselected PCRAM cells are firmly turned off.

According to various embodiments of present disclosure, with the footer transistor serially coupled between ground and the active transistor, a voltage level at the common node (node Z) connecting to the active transistor and footer transistor of the unselected cells can be pulled up higher than ground. Alternatively stated, even without applying the slightly-above-zero voltage at the WLs gating the footer transistor 206, the voltage level at the common node Z can still be pulled up higher than ground. However, it should be understood that with such a slightly-above-zero voltage, the active transistor 204 can also be assured to remain turned-off. For example, a voltage drop across the source and drain terminals of the footer transistor (e.g., the voltage level at node Z when the source terminal is connected to ground) is positively proportional to the threshold voltage of the footer transistor. A voltage level present on the source terminal of the active transistor (i.e., node Z) can thus be pulled up as a non-zero voltage, which causes the active transistor to have a negative Vgs. Accordingly, the active transistor of each of the unselected PCRAM cells can be assured to remain off, i.e., attributing significantly low leakage current.

Figure 4B:
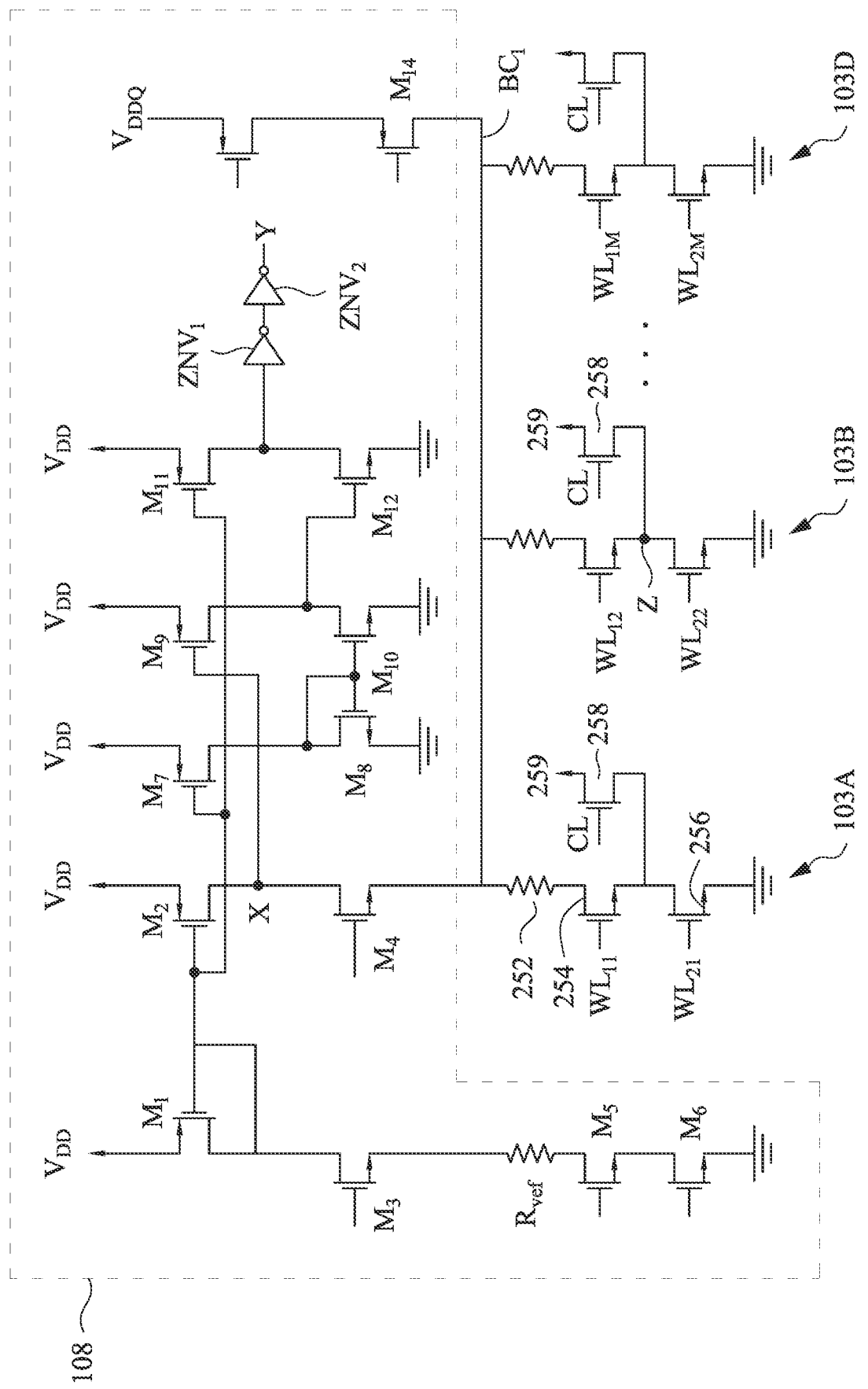
FIG. 4B illustrates a circuit diagram of an input/output (I/O) circuit of the memory device of FIG. 1 that is coupled to memory cells of FIG. 2B, in accordance with some embodiments.

FIG. 4B illustrates an example circuit diagram of the I/O circuit 108 coupled to the PCRAM cells 103A-D through $BL_1$, in accordance with various embodiments. The PCRAM cells 103A-D of FIG. 4B are each be implemented as the example of FIG. 2B, i.e., a PCRAM resistor serially coupled to a pair of transistors with an additional transistor coupled to the common node between the pair of transistors. It should be appreciated that the circuit diagram of the I/O circuit 108 shown in FIG. 4B is the same the circuit of FIG. 4A, and thus, the following discussions will be focused on the operations of the PCRAM cells.

To program a selected one of the PCRAM cells 103A-D (e.g., 103A), $BL_1$ is asserted and $WL_{11}$ and $WL_{21}$ are asserted, while the rest of the WLs are deasserted. Further, the transistors 258 of the selected and unselected PCRAM cells are all turned off through the respective CLs. The transistor M4 is turned off (e.g., by applying a logic low signal to its gate terminal), thereby disconnecting the read circuit from the PCRAM cells along $BL_1$. On the other hand, the transistors M13 and M14 are turned on (e.g., by applying a logic low signal to their gate terminals), thereby connecting the program circuit to the PCRAM cells along $BL_1$. Upon being turned on, the transistors M13 and M14 (the program circuit) can propagate a program voltage, VDDQ, to the selected PCRAM cell 103A through $BL_1$, while not propagating the program voltage to the unselected PCRAM cells, e.g., 103B-D. As a non-limiting example, when in this program mode, the program voltage, VDDQ, may be about 1.8V, $WL_{11}$ and $WL_{21}$ may be asserted with a similar level of voltage signal, 1.8V, the rest of WLs (e.g., $WL_{12}$, $WL_{22}$, $WL_{13}$, $WL_{23}$, $WL_{1M}$, $WL_{2M}$) may be deasserted with a voltage level of about 0V, and the CLs may also be supplied with a voltage level of about 0V.

To read a selected one of the PCRAM cells 103A-D (e.g., 103A), $BL_1$ is asserted and $WL_{11}$ and $WL_{21}$ are asserted, while the rest of the WLs are deasserted. Further, the transistor 258 of the selected PCRAM cell is turned off through the respective CL, while the transistors 258 of the unselected (e.g., the rest of) PCRAM cells are all turned off through the respective CLs. The transistor M4 is turned on (e.g., by applying a logic high signal to its gate terminal), thereby connecting the read circuit to the PCRAM cells along $BL_1$. On the other hand, the transistors M13 and M14 are turned off (e.g., by applying a logic high signal to their gate terminals), thereby disconnecting the program circuit from the PCRAM cells along $BL_1$. When the transistor M4 is turned on, the transistors M3, M5, and M6 are turned on. The reference resistor Rref can function as a reference to be compared with a resistance value of the selected PCRAM cell, thereby allowing the inverters INV1 and INV2 to output a logic state at node Y.

As a non-limiting example, when in this read mode, the program voltage, VDDQ, may remain at about 1.8 V, but the transistors M13 and M14 are turned off. $WL_{11}$ and $WL_{21}$ may be asserted with a voltage level at about 0.75V that corresponds to a logic high state. Further, CL gating the transistor 258 of the selected cell 103A may be supplied with a voltage level also at about 0.75V, thereby turning off the transistor 258 of the selected cell 103A. The rest of WLs that gate the active and footer transistors of the unselected cells (e.g., $WL_{12}$, $WL_{22}$, $WL_{1M}$, $WL_{2M}$) may be deasserted with a voltage level of about 0V that corresponds to a logic low state. With the logic high state applied on the gate terminals of the active transistor 204 and footer transistor 206 of the selected PCRAM cell 103A, the logic state of the PCRAM cell 103A (depending on whether or not the resistor 202 is programmed) can be read out, as discussed above. On the other hand, the gate terminals of the active and footer transistor of each of the unselected cells (e.g., 103B-D) are applied with a signal of about 0V. However, the transistors 258 of the unselected cells are all turned on, thereby pulling up a voltage level present on the source terminal of the active transistor (i.e., node Z) to be a non-zero voltage (e.g., above 0V), which causes the active transistor to have a negative Vgs. Accordingly, the active transistor of each of the unselected PCRAM cells can be assured to remain off, i.e., attributing significantly low leakage current.

Figure 5:
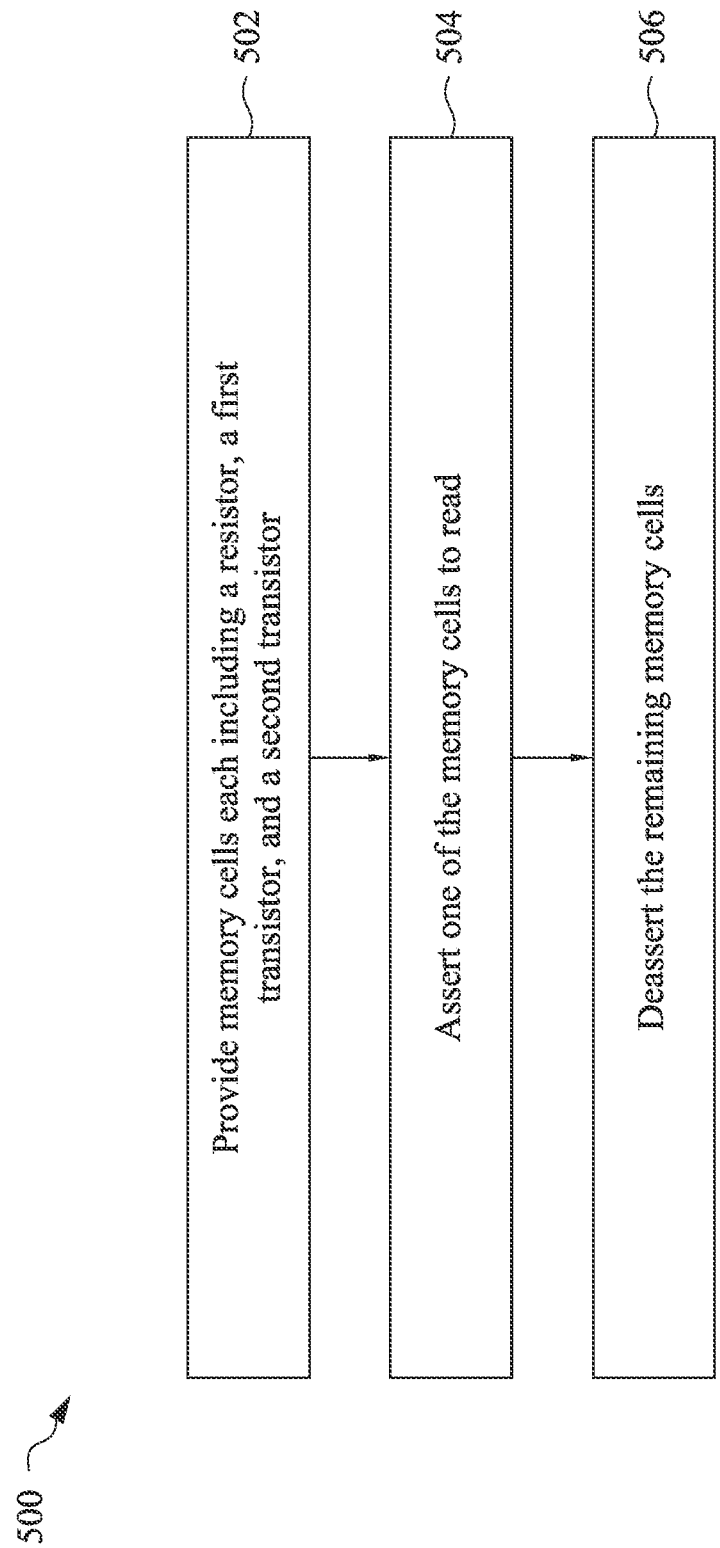
FIG. 5 illustrates a flow chart of a method to access the memory device of FIG. 1, in accordance with some embodiments.

FIG. 5 illustrates a flow chart of an example method 500 of operating (e.g., reading) an example memory device including a number of the currently disclosed memory cells (e.g., 103 of FIG. 2A or FIG. 2B), in accordance with some embodiments. It should be noted that the method 500 is merely an example and is not intended to limit the present disclosure. Accordingly, it is understood that additional steps or operations may be provided before, during, and after the method 500 of FIG. 5, and that some other operations may only be briefly described herein.

In brief overview, the method 500 starts with operation 502 of providing a number of memory cells, each of the memory cells including a resistor, a first transistor, and a second transistor coupled in series. Next, the method 500 proceeds to operation 504 of asserting one of the memory cells to read. The method 500 then proceeds to operation 506 of deasserting the remaining ones of the memory cells. In various embodiments, while reading the asserted memory cell, nodes connected between the first and second transistor of each of the remaining memory cells have a voltage level greater than zero.

In operation 502, a number of memory cells, each of which includes at least a resistor, a first transistor, and a second transistor coupled in series, are provided. For example in FIG. 2A, each of the memory cells (e.g., 103) includes a resistor (e.g., PCRAM resistor 202) with a variable resistance, a first transistor (e.g., active transistor 204) serially connecting to one end of the resistor, and a second transistor (e.g., footer transistor 206) serially connecting to the first transistor. For example in FIG. 2B, each of the memory cells (e.g., 103) includes a resistor (e.g., PCRAM resistor 252) with a variable resistance, a first transistor (e.g., active transistor 254) serially connecting to one end of the resistor, a second transistor (e.g., footer transistor 256) serially connecting to the first transistor, and a third transistor (e.g., transistor 258) connecting to a common node between the first and second transistors.

Further, the memory cells, implemented either as the example of FIG. 2A or 2B, are arranged as an array, with a number of bit lines (BL), a number of source lines (SLs), and a number of first and second word lines (WLs) intersected with one another at a corresponding one of the memory cells. For example, the other end of the resistor of each memory cell is connected to a corresponding one of the BLs (e.g., $BL_1$, $BL_2$ ... $BL_N$ of FIG. 3), a gate terminal of the first transistor of each memory cell is connected to a corresponding one of the first WLs (e.g., $WL_{11}$, $WL_{12}$, $WL_{13}$ ... $WL_{1M}$ of FIG. 3), a gate terminal of the second transistor of each memory cell is connected to a corresponding one of the second WLs (e.g., $WL_{21}$, $WL_{22}$, $WL_{23}$ ... $WL_{2M}$ of FIG. 3), and a source terminal of the second transistor of each memory cell is connected to a corresponding one of the SLs (e.g., $SL_1$ of FIG. 3).

In various embodiments, gate terminals of the first (active) transistor and second (footer) transistor of each of the memory cells may be coupled to respective WLs. For example in FIGS. 2A-B, the active transistor 204/254 is gated by a first WL, $WL_1$ (e.g., one the first WLs, $WL_{11}$, $WL_{12}$, $WL_{13}$ ... $WL_{1M}$ of FIG. 3); and the footer transistor 206/256 is gated by a second WL, $WL_2$ (e.g., one the second WLs, $WL_{21}$, $WL_{22}$, $WL_{23}$ ... $WL_{2M}$ of FIG. 3). In some alternative or additional embodiments, the first WL and second WL may be combined as a single WL, while remaining within the scope of present disclosure.

In operation 504 and 506, one of the memory cells is asserted to be read, and the other memory cells are deasserted from being accessed. The operations 504 and 506 may be performed concurrently. In some embodiments, the operation 504 includes at least asserting a pair of the first and second WLs that respectively gate the first and second transistors of the asserted memory cell (e.g., by applying signals each with a logic high state on those WLs, if the transistors are n-type); and the operation 506 includes at least deasserting remaining pairs of the first and second WLs that respectively gate the first and second transistors of remaining ones of the memory cells (e.g., by applying signals each with a logic low state on those WLs, if the transistors are n-type).

Further, when the memory cells are implemented as the example of FIG. 2A, the signals applied on the remaining pairs of first and second WLs (i.e., the first and second WLs operatively coupled to the deasserted cells) can be different, in some embodiments. For example, the signal applied on the first WL (gating the active transistor 204) may be substantially close to 0V, and the signal applied on the second WL (gating the footer transistor 206) may be slightly higher than 0V. However, it should be appreciated that those two signals can be similar to each other (e.g., both about 0V), in some other embodiments. When the memory cells are implemented as the example of FIG. 2B, the signals applied on the remaining pairs of first and second WLs (i.e., the first and second WLs operatively coupled to the deasserted cells) can be similar to each other, in some embodiments. For example, the signals applied on the first WL (gating the active transistor 254) and on the second WL (gating the footer transistor 256) may both be substantially close to 0V. However, the transistor 258 of each of the deasserted cells should be turned on, according to various embodiments of the present disclosure.

In the embodiments where the first and second transistors of the memory cells are implemented as n-type transistors, the SLs are typically connected to ground. In various embodiments of present disclosure, with the second transistor serially coupled between ground and the first transistor, a voltage level at the common node connected between the first transistor and second transistor of each of the deasserted cells can be pulled up higher than a voltage level present of the gate terminal of the first transistor (a logic low state, e.g., 0V). As a result, a negative Vgs is present on the first transistor. Accordingly, the first transistor of each of the deasserted cells can be assured to remain off, i.e., attributing significantly low leakage current when reading the asserted cell.

In one aspect of the present disclosure, a memory device is disclosed. The memory device includes a bit line (BL); a source line (SL); and a plurality of non-volatile memory cells operatively coupled between the BL and SL, respectively. Each of the plurality of non-volatile memory cells includes a resistor with a variable resistance, a first transistor, and a second transistor that are coupled to each other in series. In response to a first one of the non-volatile memory cell not being read and a second one of the non-volatile memory cell being read, a voltage level at a first node connected between the first and second transistors of the first non-volatile memory cell is greater than zero.

In another aspect of the present disclosure, a memory device is disclosed. The memory device includes a non-volatile memory cell comprising a resistor, a first transistor, and a second transistor. The resistor is operatively coupled to a bit line (BL). The first transistor is connected to the resistor in series and gated by a first word line ($WL_1$). The second transistor connected to the first transistor in series, operatively coupled to a source line (SL), and gated by a second word line ($WL_2$). When the $WL_1$ and $WL_2$ are not asserted but the BL is asserted for reading an adjacent non-volatile memory cell also operatively coupled to the same BL, a voltage level at a node commonly connecting to both the first and second transistors is increased to be higher than zero.

In yet another aspect of the present disclosure, a method for operating a memory device is disclosed. The method includes providing a plurality of memory cells coupled between a bit line (BL) and a source line (SL). Each of the plurality of memory cells comprises a resistor operatively coupled to the BL, a first transistor connected to the resistor in series, and a second transistor connected to the first transistor in series and operatively coupled to the SL. The method includes reading one of the plurality of memory cells by at least performing: (i) asserting a first pair of a plurality of word lines (WLs) that respectively gate the first and second transistors of the memory cell; and (ii) deasserting remaining pairs of the plurality of WLs that respectively gate the first and second transistors of remaining ones of the plurality of memory cells. Respective nodes connected between the first and second transistor of each of the remaining memory cells have a voltage level greater than zero.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a bit line (BL);
a source line (SL); and
a plurality of non-volatile memory cells operatively coupled between the BL and SL, respectively; wherein each of the plurality of non-volatile memory cells includes a resistor with a variable resistance, a first transistor, and a second transistor that are coupled to each other in series; and
wherein, in response to a first one of the non-volatile memory cell not being read and a second one of the non-volatile memory cell being read, a voltage level at a first node connected between the first and second transistors of the first non-volatile memory cell is greater than zero, wherein the first and second transistors are both n-type transistors.

2. The memory device of claim 1, wherein a voltage level at a second node connected between the first and second transistors of the second non-volatile memory cell is equal to zero.

3. The memory device of claim 1, further comprising:
a first word line ($WL_1$) configured to gate the first transistor of the first non-volatile memory cell with a first voltage; and
a second word line ($WL_2$) configured to gate the second transistor of the first non-volatile memory cell with a second voltage;
wherein the second voltage is greater than the first voltage thereby causing the voltage level at the first node to be greater than zero.

4. The memory device of claim 1, wherein each of the non-volatile memory cells further comprises a third transistor having a first source/drain terminal connected to both of the first and second transistors, the memory device further comprises:
a first word line ($WL_1$) configured to gate the first transistor of the first non-volatile memory cell with a first voltage; and
a second word line ($WL_2$) configured to gate the second transistor of the first non-volatile memory cell with a second voltage;
wherein the third transistor of the first non-volatile memory cell is turned on thereby causing the voltage level at the first node to be greater than zero.

5. The memory device of claim 4, wherein the first voltage is substantially equal to the second voltage.

6. The memory device of claim 4, wherein the first and second transistors have a first conduction type, and the third transistor has a second, opposite conduction type.

7. The memory device of claim 4, wherein the third transistor has a second source/drain terminal biased at a supply voltage that is substantially equal to the voltage level at the first node.

8. The memory device of claim 1, wherein the resistor has a first terminal connected to the BL and a second terminal connected to a first source/drain terminal of the first transistor, the first transistor has a second source/drain terminal connected to a first source/drain terminal of the second transistor, and the second transistor has a second source/drain terminal connected to the SL.

9. The memory device of claim 1, wherein the resistor includes a phase-change layer that has the variable resistance.

10. A memory device, comprising:
a non-volatile memory cell comprising a resistor, a first transistor, and a second transistor;
wherein the resistor is operatively coupled to a bit line (BL); the first transistor is connected to the resistor in series and gated by a first word line ($WL_1$); and the second transistor connected to the first transistor in series, operatively coupled to a source line (SL), and gated by a second word line ($WL_2$); and
wherein when the $WL_1$ and $WL_2$ are not asserted but the BL is asserted for reading an adjacent non-volatile memory cell also operatively coupled to the same BL, a voltage level at a node commonly connecting to both the first and second transistors is increased to be higher than zero, wherein the resistor includes a phase-change layer that is characterized with a variable resistance.

11. The memory device of claim 10, wherein the $WL_1$ and $WL_2$ are applied with a first voltage and a second voltage, respectively, and wherein the first voltage is less than the second voltage such that the voltage level at the node is increased to be higher than zero.

12. The memory device of claim 11, wherein the first voltage is substantially equal to 0 volt (V) and the second voltage is greater than 0V.

13. The memory device of claim 10, wherein the non-volatile memory cell further comprises a third transistor having: a first source/drain terminal connected to the node; and a second source/drain terminal connected to a supply voltage, wherein the $WL_1$ and $WL_2$ are applied with a first voltage and a second voltage, respectively, and wherein the first voltage is equal to the second voltage.

14. The memory device of claim 13, wherein the third transistor is turned on such that the voltage level at the node is increased to be higher than zero.

15. A memory device, comprising:
a bit line (BL);
a source line (SL); and
a plurality of non-volatile memory cells operatively coupled between the BL and SL, respectively, wherein each of the plurality of non-volatile memory cells includes a resistor with a variable resistance, a first transistor, and a second transistor that are coupled to each other in series;
wherein, in response to a first one of the non-volatile memory cell not being read and a second one of the non-volatile memory cell being read, a voltage level at a first node connected between the first and second transistors of the first non-volatile memory cell is greater than zero, and a voltage level at a second node connected between the first and second transistors of the second non-volatile memory cell is equal to zero, wherein the first and second transistors are both p-type transistors.

* * * * *